(12) United States Patent
Mou et al.

(10) Patent No.: US 11,703,923 B2
(45) Date of Patent: Jul. 18, 2023

(54) WEARABLE DISPLAY DEVICE

(71) Applicant: Microjet Technology Co., Ltd., Hsinchu (TW)

(72) Inventors: Hao-Jan Mou, Hsinchu (TW); Ta-Wei Hsueh, Hsinchu (TW); Yu-Tzu Chen, Hsinchu (TW); Shou-Cheng Cheng, Hsinchu (TW); Chi-Feng Huang, Hsinchu (TW); Yung-Lung Han, Hsinchu (TW); Tsung-I Lin, Hsinchu (TW); Wei-Ming Lee, Hsinchu (TW); Chin-Wen Hsieh, Hsinchu (TW)

(73) Assignee: MICRO JET TECHNOLOGY CO., LTD., Hsinchu (TW)

( * ) Notice: Subject to any disclaimer, the term of this patent is extended or adjusted under 35 U.S.C. 154(b) by 30 days.

(21) Appl. No.: 17/351,391

(22) Filed: Jun. 18, 2021

(65) Prior Publication Data

US 2022/0011837 A1  Jan. 13, 2022

(30) Foreign Application Priority Data

Jul. 10, 2020  (TW) .................................. 109123479

(51) Int. Cl.
*G06F 1/20* (2006.01)
*G06F 1/16* (2006.01)
(Continued)

(52) U.S. Cl.
CPC .......... *G06F 1/203* (2013.01); *G02B 27/0176* (2013.01); *G06F 1/163* (2013.01);
(Continued)

(58) Field of Classification Search
CPC .......... G02B 2027/0178; G02B 27/017; G02B 2027/014; G02B 7/008; G02B 27/01;
(Continued)

(56) References Cited

U.S. PATENT DOCUMENTS 9,740,023 B1 *  8/2017  Ash .......................... G02C 5/14
10,823,969 B1 *  11/2020  Hoover ............... H01M 10/653
(Continued)

FOREIGN PATENT DOCUMENTS

CN     107709919 A    2/2018
CN     210130059 U    3/2020
(Continued)

*Primary Examiner* — Michael A Matey
(74) *Attorney, Agent, or Firm* — Birch, Stewart, Kolasch & Birch, LLP

(57) ABSTRACT

A wearable display device is disclosed and includes a main body and a driving module. The main body includes a frame, two temple arms and at least one monitor. The two temple arms are respectively connected with two ends of the frame, and the monitor is disposed on the frame. The driving module is disposed within the frame and includes a microprocessor, an optical display module and a heat dissipation component. The optical display module is electrically coupled with the microprocessor and configured for displaying an optical image on the at least one monitor. The heat dissipation component includes a heat dissipation base and two heat pipes. The two heat pipes are disposed on the heat dissipation base adjacent to the microprocessor. When the heat generated by the microprocessor is conducted to the heat dissipation base, the two heat pipes perform heat exchange with the heat dissipation base.

7 Claims, 9 Drawing Sheets

(51) Int. Cl.
*G02B 27/01* (2006.01)
*H05K 7/20* (2006.01)

(52) U.S. Cl.
CPC ... *H05K 7/2099* (2013.01); *G02B 2027/0178* (2013.01); *G06F 2200/201* (2013.01)

(58) Field of Classification Search
CPC ........ G02B 2027/0174; G02B 27/0176; G06F 1/20; G06F 1/206; G06F 1/16; G06F 2200/201; G06F 3/147; G06F 1/203; G06F 1/163; H05K 7/2039; H05K 7/20963; H05K 7/20336; H05K 7/20154; H05K 7/20445; H05K 7/20981; H05K 1/0201; H05K 7/20945; H05K 7/02; H05K 1/181; H05K 7/2099; F04B 45/047; F04B 2205/05; F28D 2021/0028; F28F 2255/00; F28F 21/02

See application file for complete search history.

(56) References Cited

U.S. PATENT DOCUMENTS

| | | | |
|---|---|---|---|
| 10,852,562 B2* | 12/2020 | Moskowitz | G02C 11/10 |
| 11,493,763 B2* | 11/2022 | Lee | G02B 27/0172 |
| 2012/0194549 A1* | 8/2012 | Osterhout | G06Q 30/02 |
| | | | 345/633 |
| 2014/0022163 A1* | 1/2014 | Olsson | G02B 27/0176 |
| | | | 345/156 |
| 2016/0041395 A1* | 2/2016 | Yajima | G02B 27/017 |
| | | | 359/630 |
| 2016/0179148 A1* | 6/2016 | Takagi | G06F 1/163 |
| | | | 345/8 |
| 2016/0209659 A1* | 7/2016 | Nikkhoo | G02C 5/18 |
| 2016/0209660 A1* | 7/2016 | Nikkhoo | G02B 27/017 |
| 2016/0212889 A1* | 7/2016 | Nikkhoo | H01L 23/3736 |
| 2016/0252727 A1* | 9/2016 | Mack | G02B 27/0172 |
| | | | 345/8 |
| 2017/0115742 A1* | 4/2017 | Xing | G06F 3/0485 |
| 2018/0168066 A1* | 6/2018 | Xu | H05K 7/20154 |
| 2018/0291887 A1* | 10/2018 | Mou | F04B 49/22 |
| 2018/0376626 A1* | 12/2018 | Hurbi | G02B 7/002 |
| 2019/0107870 A1* | 4/2019 | Ali | G06F 1/203 |

FOREIGN PATENT DOCUMENTS

| | | |
|---|---|---|
| CN | 210465860 U | 5/2020 |
| TW | 201814427 A | 4/2018 |
| WO | WO 2018/004991 A1 | 1/2018 |

* cited by examiner

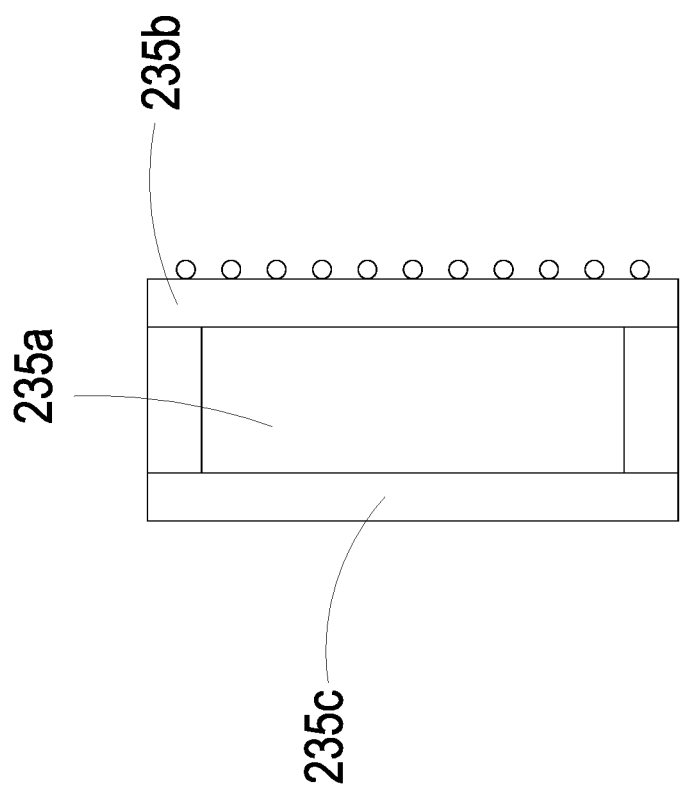

WEARABLE DISPLAY DEVICE

FIELD OF THE INVENTION

The present disclosure relates to a wearable display device, and more particularly to a head-mounted device having a heat dissipation component with excellent heat dissipation efficiency.

BACKGROUND OF THE INVENTION

With the rapid development of life science and technology in recent years, the specifications, equipment and functions of virtual reality-related peripheral devices have been rapidly upgraded. In order to satisfy the requirements thereof, the efficacy of processing chip inside the wearable display device must also be greatly improved. However, if the heat generated by the processing chip during operation under high speed cannot be removed quickly, the performance thereof will be greatly affected. In view of this shortcoming, how to provide a wearable display device that can improve the above-mentioned problems is actually an issue needs to resolve right now.

SUMMARY OF THE INVENTION

An object of the present disclosure is to provide a wearable display device. Through using a heat dissipation component with fast and excellent heat dissipation effect, the working temperature of the wearable device is reduced effectively during operation.

In accordance with an aspect of the present disclosure, a wearable display device includes a main body, a driving module. The main body includes a frame, two temple arms and at least one monitor. The two temple arms are connected with two ends of the frame, respectively, and the at least one monitor is disposed on the frame. The driving module is disposed in the frame of the main body and includes a microprocessor, an optical display module and a heat dissipation component. The optical display module is electrically connected to the microprocessor and configured for displaying an optical image on the at least one monitor. The heat dissipation component includes a heat dissipation base and two heat pipes. The two heat pipes are disposed on the heat dissipation base, and the heat dissipation base is adjacent to the microprocessor, wherein the heat generated by the microprocessor during operation is conducted to the heat dissipation base, and the two heat pipes perform heat exchange with the heat dissipation base.

BRIEF DESCRIPTION OF THE DRAWINGS

The above contents of the present disclosure will become more readily apparent to those ordinarily skilled in the art after reviewing the following detailed description and accompanying drawings, in which:

FIG. 3 is a cross sectional view illustrating a cooling chip of the wearable display device according to the embodiment of the present disclosure;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
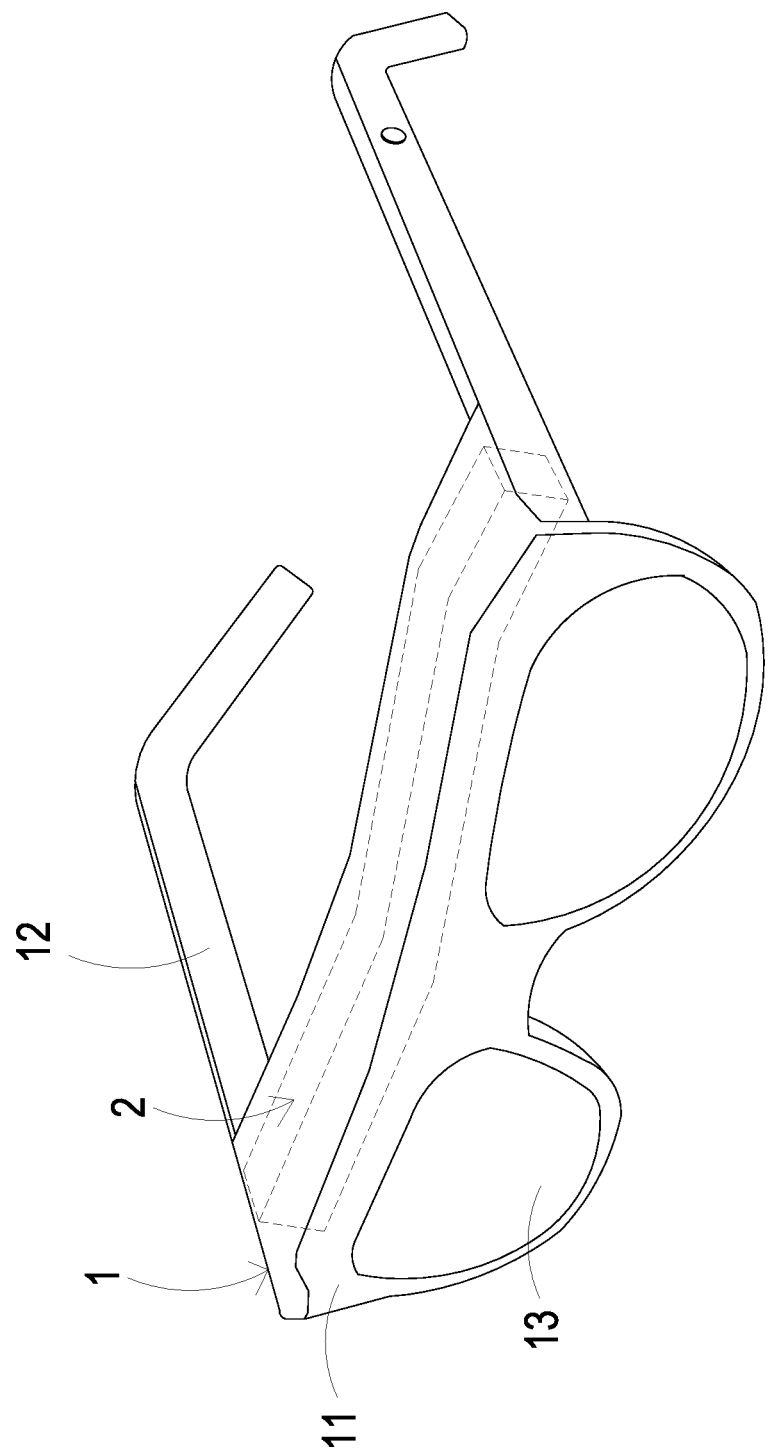
FIG. 1 is a schematic view illustrating a wearable display device according to an embodiment of the present disclosure.

As shown in FIG. 1, the present disclosure provides a wearable display device 100 including a main body 1 and a driving module 2. The main body 1 includes a frame 11, two temple arms 12 and at least one monitor 13. The two temple arms 12 are connected with two ends of the frame 11, respectively. In the embodiment, the number of the at least one monitor 13 disposed on the frame 11 in this embodiment is two. The driving module 2 is disposed in the frame 11 of the main body 1 and corresponds to the two monitors 13. When a user wears the wearable display device 100 through the two temple arms 12, the two monitors 13 are located in front of the two eyes of the user, respectively. The driving module 2 is adjacent to the monitors 13 and is configured for displaying Virtual reality (VR), Augmented reality (AR) or Extended reality (ER) image on the monitors 13, so as to be watched by the user.

Figure 2:
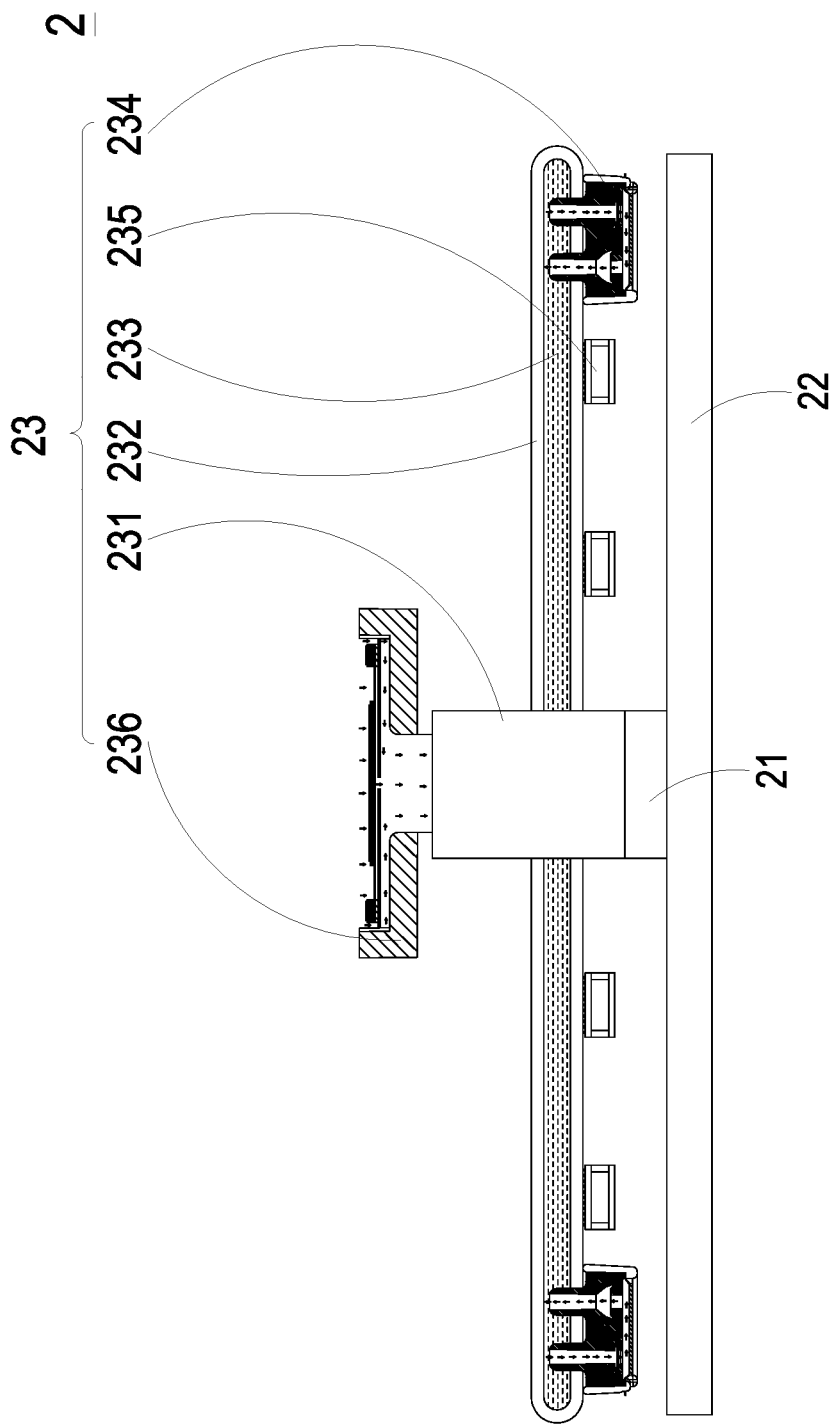
FIG. 2 is a cross sectional view illustrating a driving module of the wearable display device according to the embodiment of the present disclosure.

Please refer to FIG. 2. In the embodiment, the driving module 2 includes a microprocessor 21, an optical display module 22 and a heat dissipation component 23. The optical display module 22 is electrically connected to the microprocessor 21 and configured to receive an information of an optical image therefrom, such as a Virtual reality (VR) image, an Augmented reality (AR) image, a Mixed reality (MR) image or an Extended reality (ER) image, so as to display the optical image on the monitors 13. The heat dissipation component 23 includes a heat dissipation base 231 and two heat pipes 232. The two heat pipes 232 are disposed on the two ends of the heat dissipation base 231, respectively, and extended outwardly from two ends of the heat dissipation base 231. The heat dissipation base 231 is adjacent to the microprocessor 21. When the microprocessor 21 generates heat during operation, the heat is conducted to the heat dissipation base 231, and the two heat pipes 232 perform heat exchange with the heat dissipation base 231, so that the working temperature of the microprocessor 21 can be reduced effectively during operation.

Please refer to FIG. 2 again. In the embodiment, each of the two heat pipes 232 includes a heat dissipation liquid 233 received therein. Through the flow of the heat dissipation liquid 233, the transfer of heat energy can be speeded up, so as to enhance the effect of heat dissipation. In the embodiment, the heat dissipation component 23 further includes two liquid pumps 234. The two liquid pumps 234 are in fluid communication with the two heat pipes 232, respectively. Through the operation of the liquid pumps 234, the flow speed of the heat dissipation liquid 233 is increased, so as to improve the heat exchange performed result from the two heat pipes 232.

Please refer to FIG. 2 and FIG. 3. The heat dissipation component 23 further includes a plurality of cooling chips 235 connected to the two heat pipes 232, respectively. Each cooling chip 235 includes a refrigeration unit 235a, a condensation conduction element 235b and a heat dissipation conduction element 235c. The refrigeration unit 235a is sandwiched between the condensation conduction element 235b and the heat dissipation conduction element 235c and integrally packaged into one piece to form the cooling chip 235. In the embodiment, the condensation conduction element 235b of the cooling chip 235 is connected to the outer surface of the corresponding heat pipe 232 to exchange the heat with the corresponding heat pipe 232, so as to reduce the temperature of the corresponding heat pipe 232 and the heat dissipation liquid 233 therein, and then the heat dissipation conduction element 235c dissipates the heat to achieve the cooling effect.

In the embodiment, the heat dissipation component 23 further includes a micro pump 236. The micro pump 236 is disposed corresponding to the position of the microprocessor 21. Preferably but not exclusively, the micro pump 236 is a gas pump, which rapidly and continuously guides the gas to flow across the surface of the microprocessor 21, so that heat can be exchanged between the airflow and the microprocessor 21 to enhance the cooling effect.

Figure 4A:
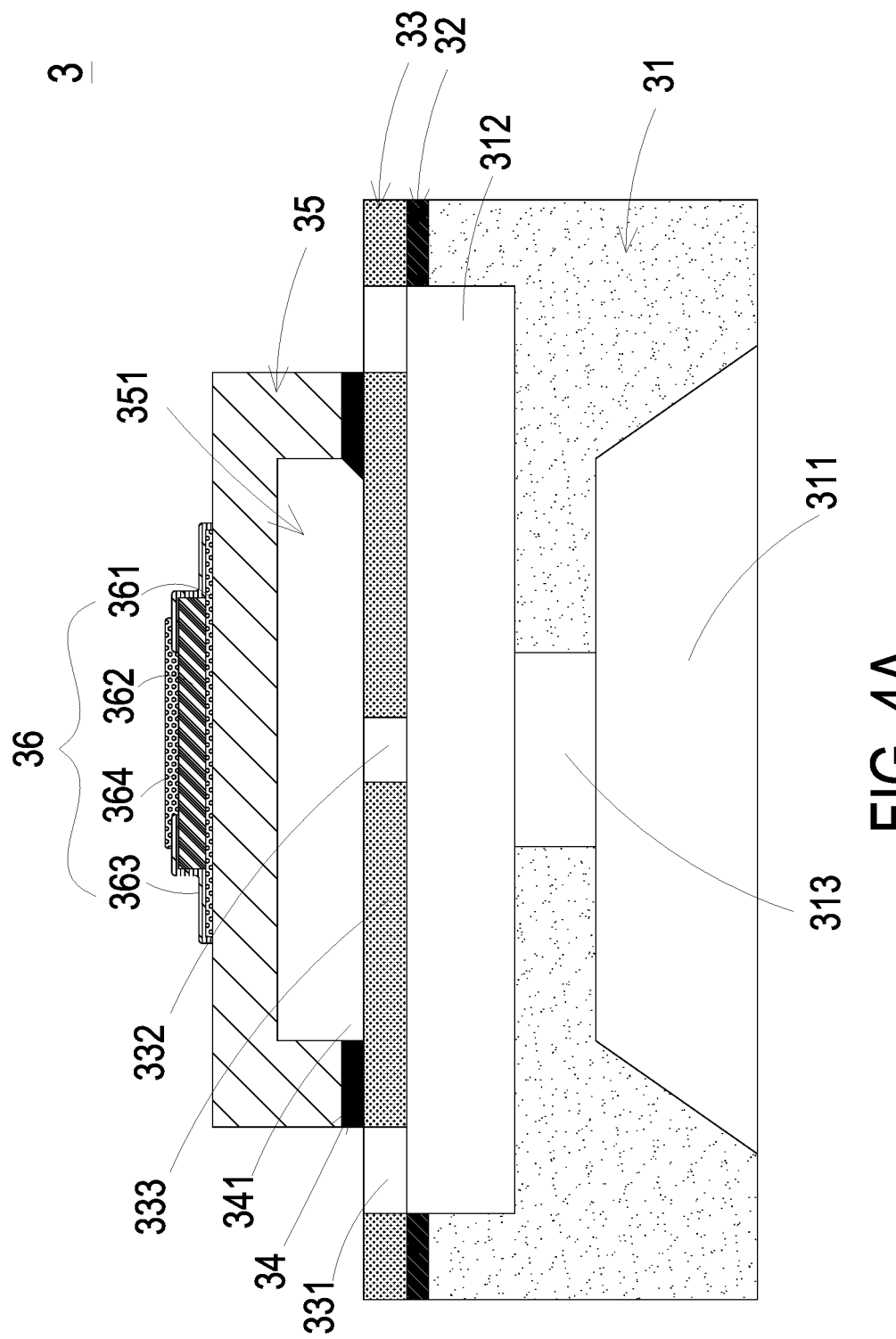
FIG. 4A is a cross sectional view illustrating a microelectromechanical-system blower according to an embodiment of the present disclosure.
Figure 4B:
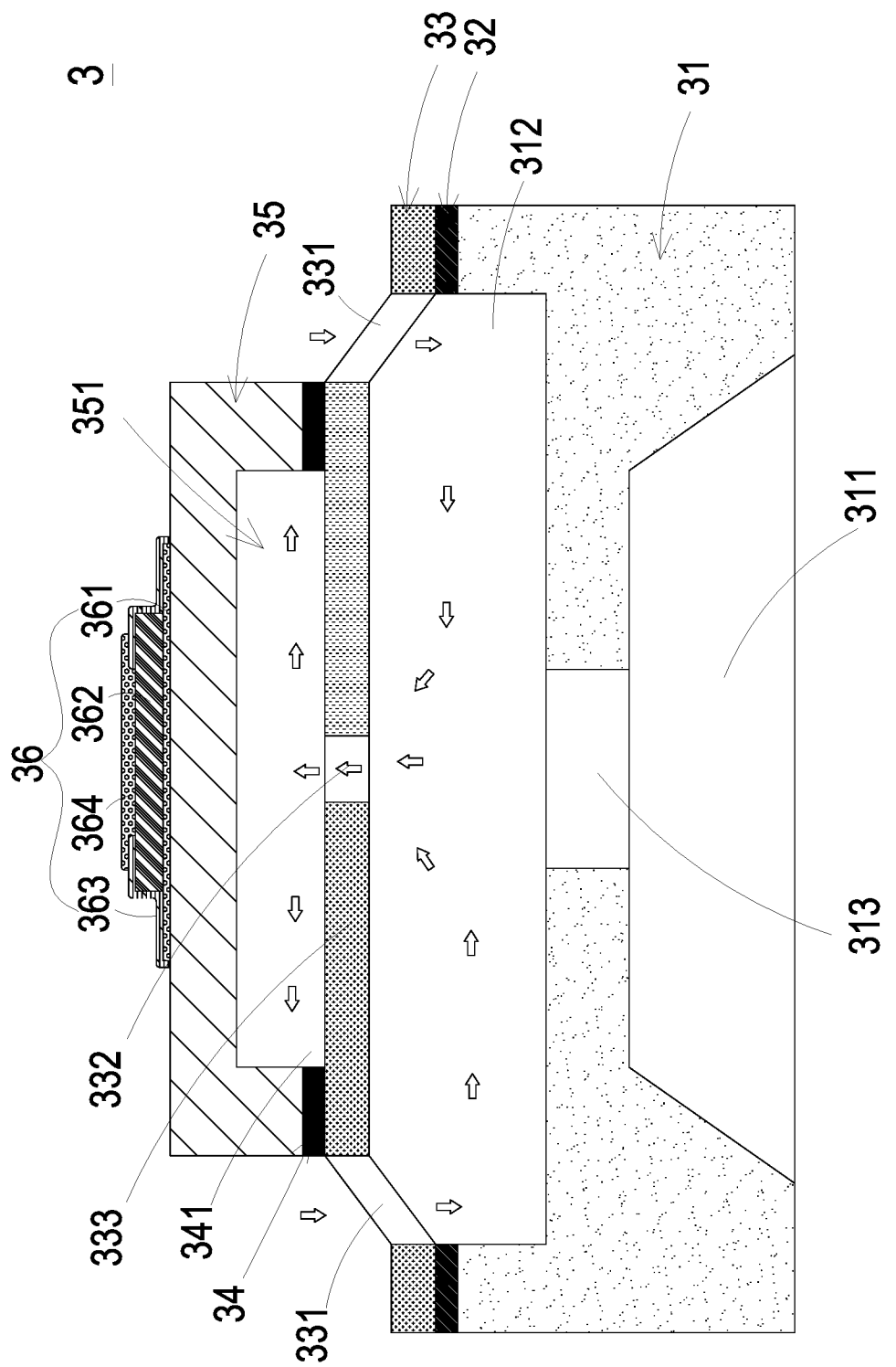
FIG. 4B to FIG. 4C schematically illustrate the operation steps of the microelectromechanical-system blower of the wearable display device according to the embodiment of the present disclosure.
Figure 4C:
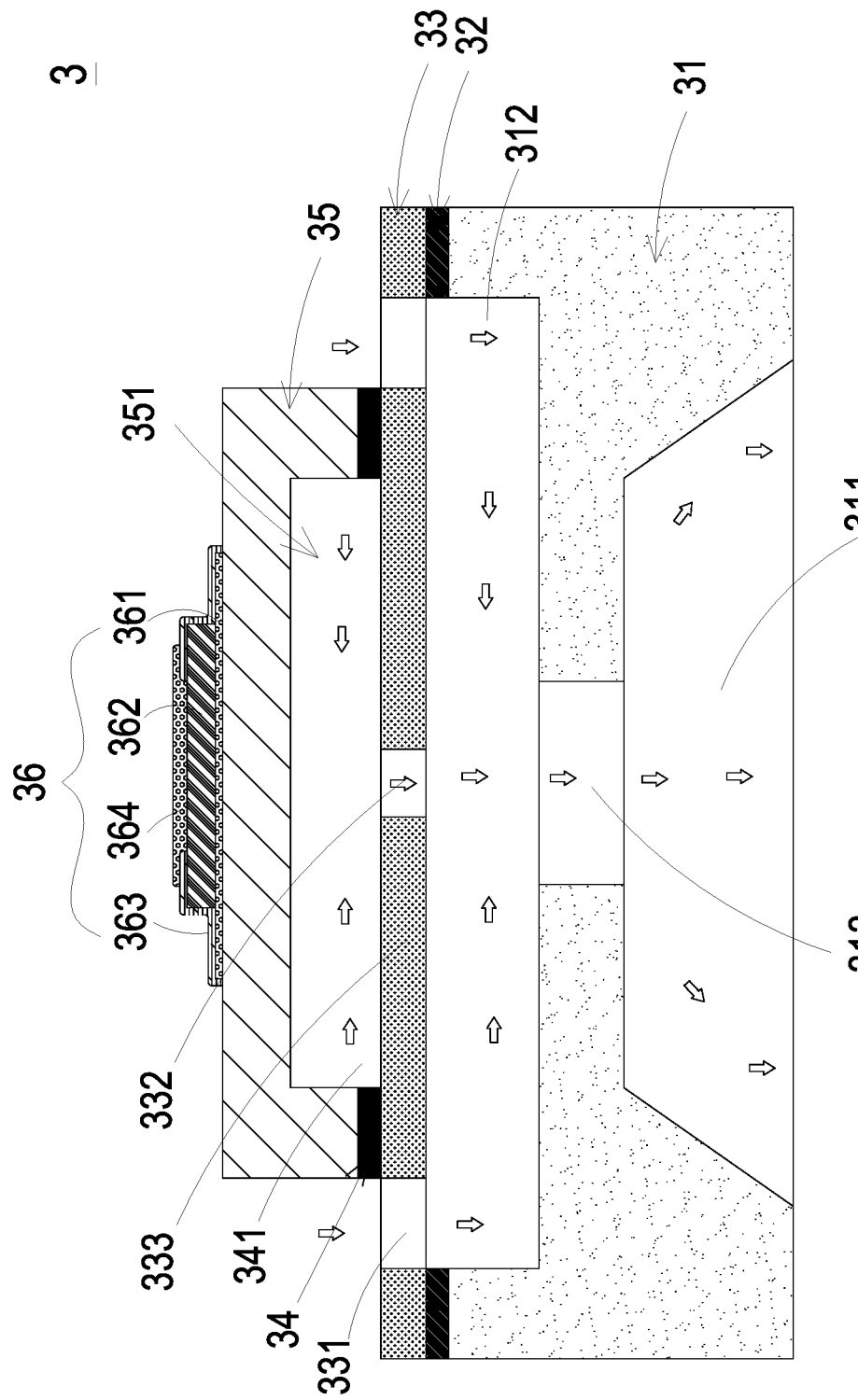

A first embodiment of the micro pump 236 is shown in FIG. 4A to FIG. 4C. In the embodiment, the micro pump 236 is a microelectromechanical-system blower 3 and includes an outlet base 31, a first oxidation layer 32, a gas jetting resonance layer 33, a second oxidation layer 34, a resonance-chamber layer 35 and a first piezoelectric component 36, which are all manufactured by semiconductor process. In the embodiment, the semiconductor process includes at least one etching process and at least one deposition process. The etching process is one selected from the group consisting of a wet etching process, a dry etching process and a combination thereof, but not limited thereto. The deposition process is one selected from the group consisting of a physical vapor deposition process (PVD), a chemical vapor deposition process (CVD) and a combination thereof, and not redundantly described hereafter.

In the embodiment, the outlet base 31 includes an outlet chamber 311 and a compression chamber 312 formed by a silicon-substrate etching process. A through hole 313 is formed between the outlet chamber 311 and the compression chamber 312 through etching. In the embodiment, the first oxidation layer 32 is formed and stacked on the outlet base 31 by deposition process, and a part thereof corresponding to the compression chamber 312 is etched and removed. The gas jetting resonance layer 33 is formed and stacked on the first oxidation layer 32 by a silicon-substrate deposition process. A plurality of inlet apertures 331 are formed by etching to remove a part of gas jetting resonance layer 33 corresponding to the compression chamber 312, and a gas-jetting hole 332 is formed by etching to remove a part of gas-jetting resonance layer 33 corresponding to a center of the compression chamber 312, so that a suspension section 333 capable of displacing and vibrating is formed between the inlet apertures 331 and the gas-jetting hole 332. In the embodiment, the second oxidation layer 34 is formed and stacked on the suspension section 333 of the gas jetting resonance layer 33 by a deposition process. A resonance-chamber section 341 is formed by partially etching and in fluid communication with the gas-jetting hole 332. In the embodiment, the resonance-chamber layer 35 includes a resonance chamber 351 formed by a silicon-substrate etching process and correspondingly connected and stacked on the second oxidation layer 34, so that the resonance chamber 351 is corresponding to the resonance-chamber section 341 of the second oxidation 34. In the embodiment, the first piezoelectric component 36 formed and stacked on the resonance-chamber layer 35 by deposition process includes a first lower electrode layer 361, a first piezoelectric layer 362, a first insulation layer 363 and a first upper electrode layer 364. The first lower electrode layer 361 is formed and stacked on the resonance-chamber layer 35 by a deposition process. The first piezoelectric layer 362 is formed and stacked on the first lower electrode layer 361 by a deposition process. The first insulation layer 363 is formed and stacked on a partial surface of the first piezoelectric layer 362 by a deposition process. The first upper electrode layer 364 is formed and stacked on the first insulation layer 363 and a remaining surface of the first piezoelectric layer 362 without the first insulation layer 363 disposed thereon by a deposition process, so as to electrically connect with the first piezoelectric layer 362.

The structure of the microelectromechanical-system blower 3 can be appreciated from above description. The operation steps of the microelectromechanical-system blower 3 are illustrated in FIG. 4B to FIG. 4C. When the first piezoelectric component 36 is driven to drive the gas-jetting resonance layer 33 and generate a resonance effect, the suspension section 333 of the gas-jetting resonance layer 33 is vibrated and shifted to and for, whereby a gas is inhaled into the compression chamber 312 through the plurality of inlet apertures 331, flows through the gas-jetting hole 332 and is transported into the resonance chamber 351. Through controlling the vibration frequency of the gas in the resonance chamber 351 and making it close to the vibration frequency of the suspension section 333, the Helmholtz resonance effect is introduced between the resonance chamber 351 and the suspension section 333, whereby the gas collected in the resonance chamber 351 is discharged out and transported to the compression chamber 312, flows through the through hole 313, and then is discharged out from the outlet chamber 311 with high pressure, so as to achieve gas transportation.

Figure 5A:
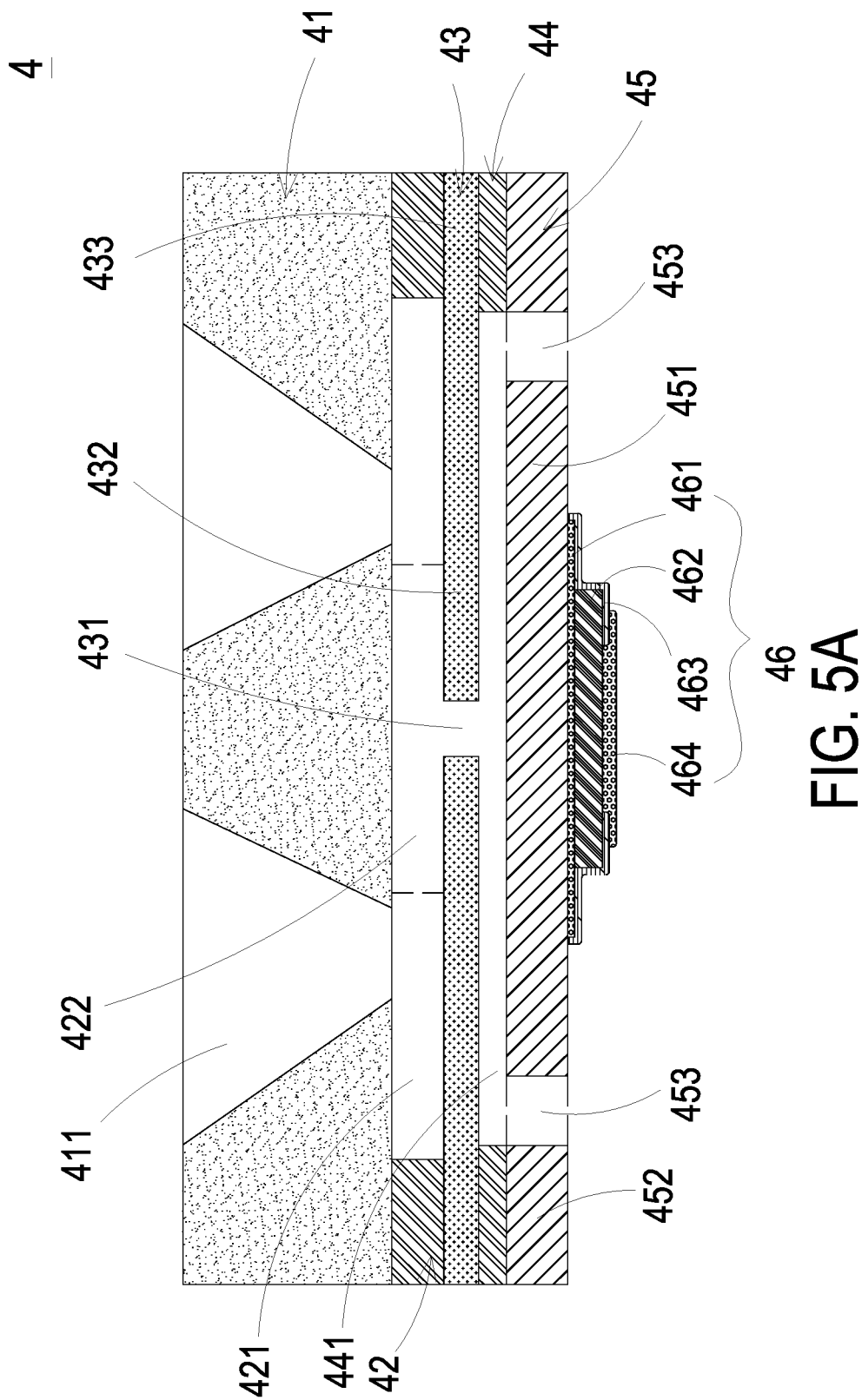
FIG. 5A is a cross sectional view illustrating a microelectromechanical-system pump according to an embodiment of the present disclosure.
Figure 5B:
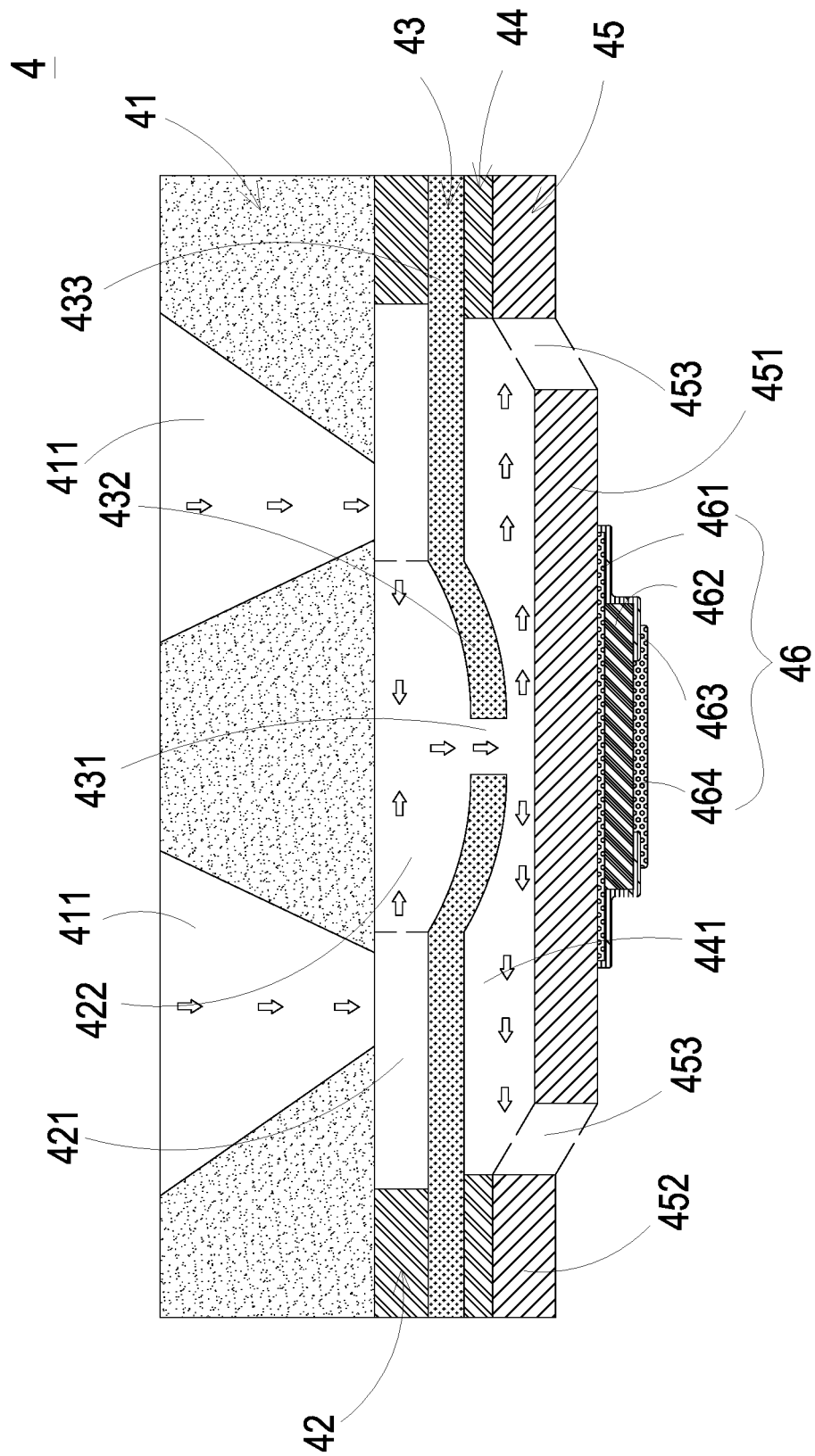
FIG. 5B to FIG. 5C schematically illustrate the operation steps of the microelectromechanical-system pump of the wearable display device according to the embodiment of the present disclosure.
Figure 5C:
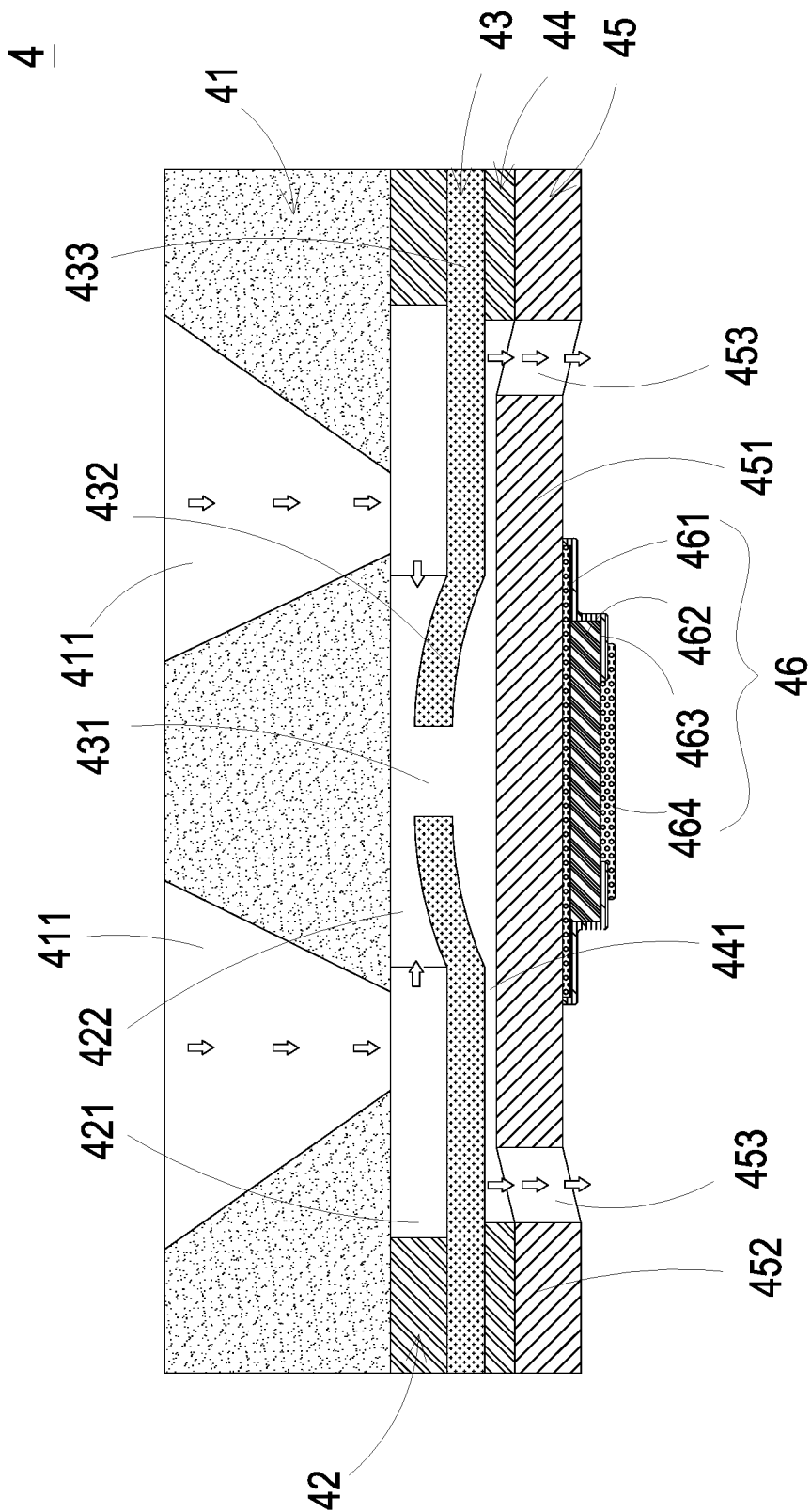

A second embodiment of the micro pump 236 is shown in FIG. 5A to FIG. 5C. In the embodiment, the micro pump 236 is a microelectromechanical-system pump 4. As shown in FIG. 5A, FIG. 5B and FIG. 5C, the microelectromechanical-system pump 4 includes an inlet base 41, a third oxidation layer 42, a resonance layer 43, a fourth oxidation layer 44, a vibration layer 45 and a second piezoelectric component 46, which are all manufactured by semiconductor process. In the embodiment, the semiconductor process includes at least one etching process and at least one deposition process. The etching process is one selected from the group consisting of a wet etching process, a dry etching process and a combination thereof, but not limited thereto. The deposition process is one selected from the group consisting of a physical vapor deposition process (PVD), a chemical vapor deposition process (CVD) and a combination thereof, and not redundantly described hereafter.

In the embodiment, the inlet base 41 includes at least one inlet aperture 411 formed by a silicon-substrate etching process. In the embodiment, the third oxidation layer 42 is formed and stacked on the inlet base 41 by a deposition process. The third oxidation layer 42 includes a plurality of convergence channels 421 and a convergence chamber 422 formed by an etching process. The plurality of convergence channels 421 are in fluid communication between the convergence chamber 422 and the at least one inlet aperture 411 of the inlet base 41. The resonance layer 43 is formed and stacked on the third oxidation layer 42 by a silicon-substrate deposition process, and includes a central through hole 431, a vibration section 432 and a fixed section 433 formed by an etching process. The central through hole 431 is formed at a center of the resonance layer 43. The vibration section 432 is disposed around a peripheral region of the central through hole 431, and the fixed section 433 is disposed around a peripheral region of the resonance layer 43. The fourth oxidation layer 44 is formed and stacked on the resonance layer 43 by a deposition process, and includes a compression-chamber section 441 formed by partially etching. In the embodiment, the vibration layer 45 is formed and stacked on the fourth oxidation layer 44 by a silicon-substrate deposition process and includes an actuating section 451, an outer peripheral section 452 and a plurality of gas apertures 453 formed by an etching process. The actuating section 451 is disposed at a central part of the vibration layer 45. The outer peripheral section 452 is disposed around an outer periphery of the actuating section 451, and the plurality of gas apertures 453 are formed between the actuating section 451 and the outer peripheral section 452, respectively. A compression chamber is collaboratively defined by the vibration layer 45 and the compression-chamber section 441 of the fourth oxidation layer 44. The second piezoelectric component 46 is formed and stacked on the actuating section 451 of the vibration layer 45 by a deposition process and includes a second lower electrode layer 461, a second piezoelectric layer 462, a second insulation layer 463 and a second upper electrode layer 464. The second layer electrode layer 461 is formed and stacked on the actuating section 451 of the vibration layer 45 by a deposition process. The second piezoelectric layer 462 is formed and stacked on a partial surface of the second lower electrode layer 461 by a deposition process. The second insulation layer 463 is formed and stacked on a partial surface of the second piezoelectric layer 462 by a deposition process. The second upper electrode layer 464 is formed and stacked on the second insulation layer 463 and a remaining surface of the second piezoelectric layer 462 without the second insulation layer 463 disposed thereon by a deposition process, so as to electrically connect with the second piezoelectric layer 462.

The structure of the microelectromechanical-system pump 4 can be appreciated from the above description. The operation steps of the microelectromechanical-system pump 4 are illustrated in FIG. 5B to FIG. 5C. When the second piezoelectric component 46 is driven to drive the vibration layer 45 and generate a resonance effect with the resonance layer 43, the gas is introduced from the at least one inlet aperture 411, converged to the convergence chamber 422 through the plurality of convergence channels 421, flowed through the central through hole 431 of the resonance layer 43, and then discharged out through the plurality of gas apertures 453 of the vibration layer 45, so as to achieve gas transportation at high flow rate.

In summary, the present disclosure provides a wearable display device using a heat dissipation component to cool the driving module. The two heat pipes of the heat dissipation component are extended toward the two ends thereof to increase the heat dissipation area. The heat dissipation liquid in side the two heat pipes is used to increase the thermal conductivity, and the liquid pump is added to accelerate the transmission of the heat dissipation liquid, so that the speed of the heat dissipation can be accelerated. Furthermore, the cooling chips are used to preform heat exchange, and the micro pump is used to transport gas.

While the disclosure has been described in terms of the most practical and preferred embodiments, it is to be understood that the disclosure needs not be limited to the disclosed embodiments. On the contrary, it is intended to cover various modifications and similar arrangements included within the spirit and scope of the appended claims so as to encompass all such modifications and similar structures.

What is claimed is:
1. A wearable display device comprising:
   a main body comprising a frame, two temple arms and at least one monitor, wherein the two temple arms are connected with two ends of the frame, respectively, and the at least one monitor is disposed on the frame; and
   a driving module disposed in the frame of the main body comprising:
   a microprocessor;
   an optical display module electrically connected to the microprocessor and configured for displaying an optical image on the at least one monitor; and
   a heat dissipation component comprising a heat dissipation base, two heat pipes comprising a heat dissipation liquid received therein and two liquid pumps, wherein the two liquid pumps are in fluid communication with the two heat pipes, respectively, so as to accelerate a heat exchange performed by the two heat pipes, the two heat pipes are disposed on the heat dissipation base and the heat dissipation base is adjacent to the microprocessor, wherein when the microprocessor generates heat during operation, the heat is conducted to the heat dissipation base, and the two heat pipes perform the heat exchange with the heat dissipation base.

2. The wearable display device according to claim 1, wherein the heat dissipation component comprises a micro pump, and the micro pump is disposed corresponding to the microprocessor.

3. The wearable display device according to claim 2, wherein the micro pump is a microelectromechanical-system blower and comprises:
   an outlet base comprising an outlet chamber and a compression chamber formed by a silicon-substrate etching process, wherein a through hole is formed between the outlet chamber and the compression chamber through etching;
   a first oxidation layer formed and stacked on the outlet base, wherein a part corresponding to the compression chamber is etched and removed;
   a gas-jetting resonance layer formed and stacked on the first oxidation layer by a silicon-substrate deposition process, wherein a plurality of inlet apertures are formed by etching and removing a part of the gas-jetting resonance layer corresponding to the compression chamber, and a gas-jetting hole is formed by etching and removing a part of the gas-jetting resonance layer corresponding to a center of the compression chamber, so that a suspension section capable of shifting and vibrating is formed between the inlet apertures and the gas-jetting hole;
   a second oxidation layer formed and stacked on the suspension section of the gas-jetting resonance layer by a deposition process, wherein a resonance-chamber section is formed by partially etching and in fluid communication with the gas-jetting hole;

a resonance-chamber layer comprising a resonance chamber formed by a silicon-substrate etching process, and correspondingly connected and stacked on the second oxidation layer, so that the resonance chamber is corresponding to the resonance-chamber section of the second oxidation; and a first piezoelectric component formed and stacked on the resonance-chamber layer, and comprising a first lower electrode layer, a first piezoelectric layer, a first insulation layer and a first upper electrode layer, wherein the first lower electrode layer is formed and stacked on the resonance-chamber layer by a deposition process, the first piezoelectric layer is formed and stacked on a partial surface of the first lower electrode layer by a deposition process, the first insulation layer is formed and stacked on a partial surface of the first piezoelectric layer by a deposition process, and the first upper electrode layer is formed and stacked on the first insulation layer and a remaining surface of the first piezoelectric layer without the first insulation layer disposed thereon by a deposition process, so as to electrically connect with the first piezoelectric layer;

wherein when the first piezoelectric component is driven to drive the gas-jetting resonance layer and generate a resonance effect, the suspension section of the gas-jetting resonance layer is vibrated and shifted, whereby a gas is inhaled into the compression chamber through the plurality of inlet apertures, flowed through the gas-jetting hole and transported into the resonance chamber, wherein the gas collected in the resonance chamber is discharged out and transported to the compression chamber, flowed through the through hole, and then discharged out from the outlet chamber with high pressure, so as to achieve gas transportation.

4. The wearable display device according to claim 2, wherein the micro pump is a microelectromechanical-system pump and comprises:

an inlet base comprising at least one inlet aperture formed by a silicon-substrate etching process;

a third oxidation layer formed and stacked on the inlet base by a deposition process, wherein the third oxidation layer comprises a plurality of convergence channels and a convergence chamber formed by an etching process, and the plurality of convergence channels are in fluid communication between the convergence chamber and the at least one inlet aperture of the inlet base;

a resonance layer formed and stacked on the third oxidation layer by a silicon-substrate deposition process, and comprising a central through hole, a vibration section and a fixed section formed by an etching process, wherein the central through hole is formed at a center of the resonance layer, the vibration section is disposed around a peripheral region of the central through hole, and the fixed section is disposed around a peripheral region of the resonance layer;

a fourth oxidation layer formed and stacked on the resonance layer by a deposition process, and comprising a compression-chamber section formed by partially etching;

a vibration layer formed and stacked on the fourth oxidation layer by a silicon-substrate deposition process and comprising an actuating section, an outer peripheral section and a plurality of gas apertures formed by an etching process, wherein the actuating section is disposed at a central part of the vibration layer, the outer peripheral section is disposed around an outer periphery of the actuating section, and the plurality of gas apertures are formed between the actuating section and the outer peripheral section, respectively; and a second piezoelectric component formed and stacked on the actuating section of the vibration layer by a deposition process and comprising a second lower electrode layer, a second piezoelectric layer, a second insulation layer and a second upper electrode layer, wherein the second lower electrode layer is formed and stacked on the actuating section of the vibration layer by a deposition process, the second piezoelectric layer is formed and stacked on a partial surface of the second lower electrode layer by a deposition process, the second insulation layer is formed and stacked on a partial surface of the second piezoelectric layer by a deposition process, and the second upper electrode layer is formed and stacked on the second insulation layer and a remaining surface of the second piezoelectric layer without the second insulation layer disposed thereon by a deposition process, so as to electrically connect with the second piezoelectric layer;

wherein when the second piezoelectric component is driven to drive the vibration layer and generate a resonance effect, the gas is introduced from the at least one inlet aperture, converged to the convergence chamber through the plurality of convergence channels, flowed through the central through hole of the resonance layer, and then discharged out through the plurality of gas apertures of the vibration layer, so as to achieve gas transportation.

5. The wearable display device according to claim 1, wherein the heat dissipation component further comprises a plurality of cooling chips connected to the two heat pipes, respectively.

6. The wearable display device according to claim 5, wherein each of the plurality of the cooling chips includes a refrigeration unit, a condensation conduction element and a heat dissipation conduction element, wherein the refrigeration unit is sandwiched between the condensation conduction element and the heat dissipation conduction element and integrally packaged into one piece to form the cooling chip.

7. The wearable display device according to claim 2, wherein the micro pump is a gas pump.

* * * * *